United States Patent
Houston et al.

(10) Patent No.: US 7,101,772 B2
(45) Date of Patent: Sep. 5, 2006

(54) MEANS FOR FORMING SOI

(75) Inventors: Theodore W. Houston, Richardson, TX (US); Keith A. Joyner, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1054 days.

(21) Appl. No.: 10/007,839

(22) Filed: Nov. 8, 2001

(65) Prior Publication Data

US 2002/0086463 A1    Jul. 4, 2002

Related U.S. Application Data

(60) Provisional application No. 60/259,400, filed on Dec. 30, 2000.

(51) Int. Cl.
*H01L 21/00* (2006.01)

(52) U.S. Cl. .................. 438/455; 438/311; 438/149

(58) Field of Classification Search .............. 438/409, 438/406, 407, 408, 149, 412, 753, 509, 459, 438/977, 960, 455, 311
See application file for complete search history.

(56) References Cited

U.S. PATENT DOCUMENTS

| | | | | |
|---|---|---|---|---|
| 4,910,165 A | * | 3/1990 | Lee et al. | 437/30 |
| 5,023,200 A | * | 6/1991 | Blewer et al. | 437/187 |
| 5,950,094 A | * | 9/1999 | Lin et al. | 438/409 |
| 6,096,582 A | * | 8/2000 | Inoue et al. | 438/149 |
| 6,143,629 A | * | 11/2000 | Sato | 438/455 |
| 6,200,878 B1 | * | 3/2001 | Yamagata et al. | 438/406 |
| 6,246,068 B1 | * | 6/2001 | Sato et al. | 257/3 |
| 6,277,703 B1 | * | 8/2001 | Barlocchi et al. | 438/412 |
| 6,294,478 B1 | * | 9/2001 | Sakaguchi et al. | 438/753 |
| 6,326,279 B1 | * | 12/2001 | Kakizaki et al. | 438/406 |
| 6,335,269 B1 | * | 1/2002 | Sato | 438/509 |
| 6,566,255 B1 | * | 5/2003 | Ito | 438/660 |
| 6,593,211 B1 | * | 7/2003 | Sato | 438/455 |
| 6,613,638 B1 | * | 9/2003 | Ito | 438/311 |
| 6,762,057 B1 | * | 7/2004 | Gilton | 436/161 |
| 6,858,508 B1 | * | 2/2005 | Ito | 438/311 |

* cited by examiner

*Primary Examiner*—Laura M. Schillinger
(74) *Attorney, Agent, or Firm*—Wade James Brady, III; Frederick J. Telecky, Jr.

(57) ABSTRACT

A method for forming a SOI structure in which porous silicon is sealed and an epitaxial layer is grown thereover, followed by implantation of oxygen and annealing.

14 Claims, 2 Drawing Sheets

MEANS FOR FORMING SOI

This application claims priority under 35 USC § 119(e)(1) of provisional applications No. 60/259,400 filed Dec. 30, 2000.

BACKGROUND AND SUMMARY OF THE INVENTION

The present invention relates to integrated circuit structures and fabrication methods, and particularly to formation of silicon-on-insulator wafers.

BACKGROUND

Silicon on insulator (SOI) devices are important additions to IC technology for many reasons, allowing isolation of devices, low power, and low voltage technologies, as well as reducing parasitic capacitance and the accompanying latch-up. Many technologies have been developed for the fabrication of SOI devices, including separation by implanted oxygen and bonded wafers.

Porous silicon has also been used to form SOI by bonding wafers and later removing the porous layer, leaving an epi layer with an oxide (which was originally grown on the epi by conventional means, and sandwiched by another wafer). The porous silicon in such a process is used as an etch-stop for the BOX.

Means for Forming SOI

The present application discloses an innovative way to make a SOI wafer. In the preferred embodiment, a wafer surface is anodized to form a porous silicon layer at the surface, which is sealed, preferably by heating it in an H2 ambient, after cleaning to remove any surface oxide. A thin silicon film is then formed by standard deposition techniques. The porous silicon is then implanted with a low dose of oxygen, followed by a high temperature anneal. The oxygen implant forms the buried oxide layer. Additional epi layers may be formed on the layer of monocrystalline silicon on the surface.

Advantages of the disclosed methods and structures, in various embodiments, can include one or more of the following:

porosity of silicon prevents clumping (formation of clusters rather than a uniform layer) of SiO2 with low dose;
relatively thick dielectric layer for given dose size;
aids in planarity of SPIMOX;
porous silicon readily oxidizes, allowing sharp definition of oxide layer.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
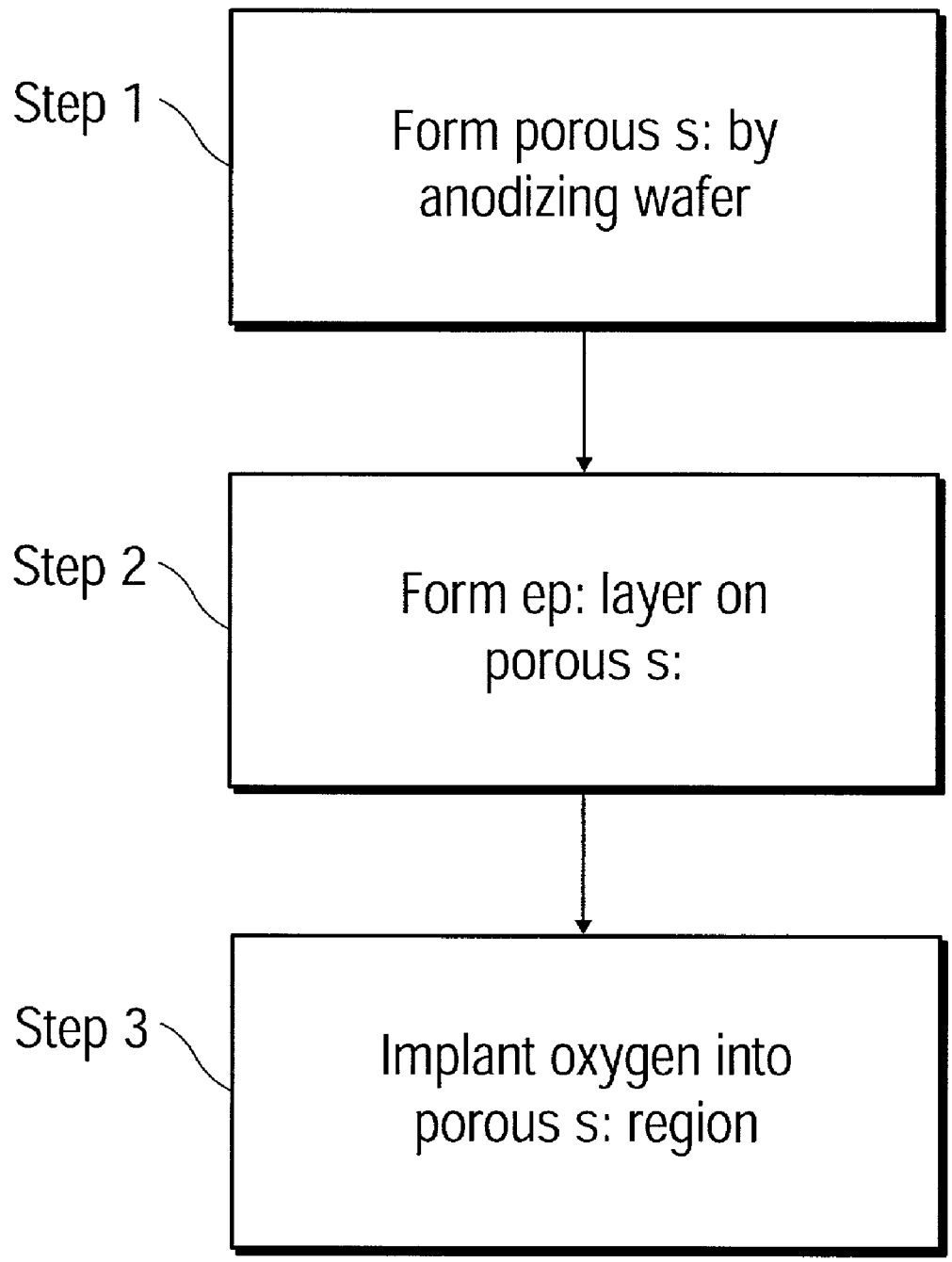
FIG. 1 shows a flow chart of the preferred embodiment.

FIG. 1 shows a series of steps for practicing the preferred embodiment. First a layer of porous silicon is formed by anodizing a boron doped (0.001–0.02 ohm-cm) silicon wafer (step 1). In the preferred embodiment, a HF+C2H5OH combination is used. The depth of the porous silicon can be controlled by timing or by limiting the depth of the boron doping. Thicknesses in the range of nanometers to microns can be obtained. Next the porous silicon surface is cleaned by diluted HF and then by deionized water in order to remove only the wafer surface oxide. Next an epitaxial layer is grown on the porous silicon surface (step 2). The porous layer is then implanted with oxygen using a plasma oxygen implant or other oxygen implantation methods (step 3).

The present application teaches that the porous silicon can be covered with a layer of epi and converted to an oxide by introducing oxygen into the porous silicon. At least a thin layer of epi should be formed prior to oxidation of the porous silicon. Additional epi layers may be added later.

Figure 2A:
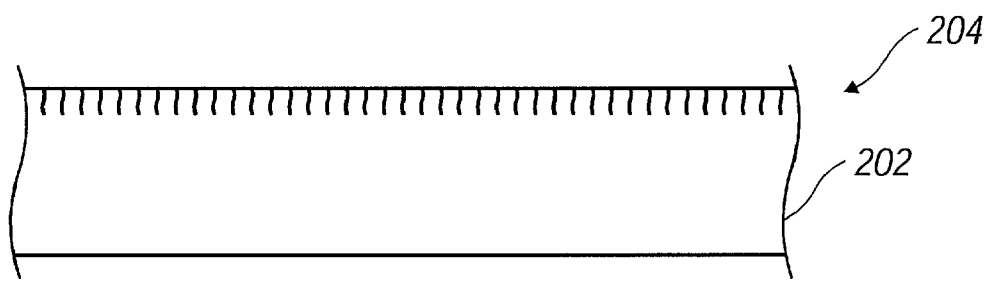
FIGS. 2a–2c show the formation of the SOI structure at different process steps.
Figure 2B:
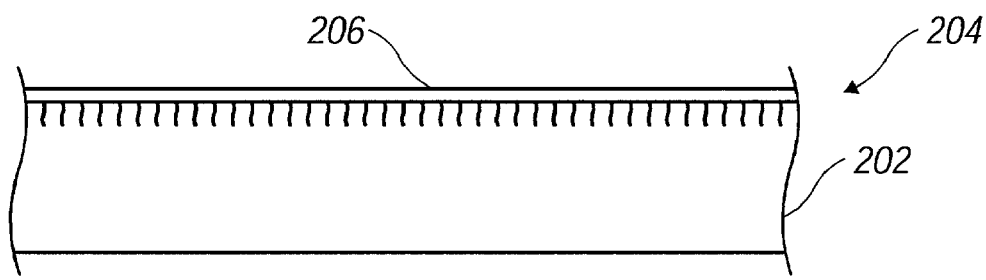
Figure 2C:
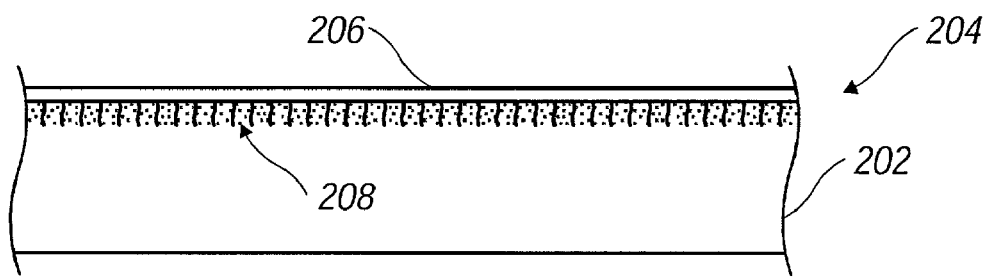

FIGS. 2a–2c show the innovative formation of the SOI during various fabrication steps. FIG. 2a shows the wafer substrate 202 after anodizing. The top surface of the wafer exhibits cracks extending into the depth of the surface resulting from the anodizing process. This area of the wafer comprises the porous silicon 204. The porous silicon 204 is treated by a prebake to fill up some of the surface pores with silicon atoms that migrate toward the pores in order to reduce the surface energy of the wafer.

FIG. 2b shows the wafer 202 and porous silicon 204 covered by a thin layer of epi 206. The quality of the epi 206 depends on the surface pore filling during the sealing bake of the wafer in a nitrogen, hydrogen, or inert ambient. A thin layer of epi used as a seal is required to give a starting point for later epi growth.

FIG. 2c shows the wafer 202 and porous silicon 204 with the epi layer 206. Oxygen 208 has been implanted into the porous silicon through the epi layer. Note that the oxygen implantation could be performed before the final epi formation. Oxygen doses on the order of $10^{17}$ to $10^{18}$ oxygen ions per $cm^2$ are used in the preferred embodiment. Though $10^{18}$ is a relatively heavy dose, this may be done cheaply with plasma implantation into the BOX. High temperatures are used during oxidation, on the order of 1000 C for about 30 minutes.

Another possible process flow grows the epi layer over the porous silicon before the oxygen is implanted. As another variation, a standard but low dose oxygen implant can be used instead of using SPIMOX.

The porous silicon surface, after it has been formed but before oxygen has been implanted or epi has been grown, can be sealed in an inert ambient, a nitrogen ambient, or a hydrogen ambient, depending on the process.

According to a disclosed class of innovative embodiments, there is provided: A method of forming a semiconductor-on-insulator structure, comprising the steps of: a) forming a structure having porous semiconductor material at a first surface thereof; b) introducing an oxidizing species into said porous semiconductor material; and, either before or after step b), c) forming an epitaxial semiconductor layer on said porous semiconductor material, and reacting said oxidizing species with said porous semiconductor material to form a buried dielectric layer beneath said epitaxial layer.

According to another disclosed class of innovative embodiments, there is provided: A method of forming a semiconductor-on-insulator structure, comprising the steps of: a) anodizing a silicon wafer to form porous silicon; b) introducing oxygen into said porous silicon; and, either before or after step b), c) forming a semiconductor layer on said porous silicon, and reacting said oxygen with said porous semiconductor material to form a buried oxide layer.

According to another disclosed class of innovative embodiments, there is provided: A method of forming a semiconductor-on-insulator structure, comprising the steps of: a) partially anodizing a silicon wafer to form porous silicon; and thereafter b) forming an epitaxial semiconductor layer on said porous silicon; and thereafter c) introducing oxygen into said porous silicon, and reacting said oxygen with said porous silicon to form a buried oxide layer.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Impurities can be incorporated into the BOX to alter the characteristics of the device.

It is also contemplated that Si/Ge layers can be grown over a porous-silicon-derived oxide layer.

Also, in alternative embodiments the porous silicon does not have to be completely oxidized.

In another class of alternative embodiments, it is contemplated that the oxidizing species does not have to be derived from molecular oxygen, but can be derived from oxidizing gasses such as $O_3$ or $N_2O$.

In another class of alternative embodiments, it is contemplated that other elements besides oxygen can be used for the self-segregating reaction which forms the buried layer.

The teachings above are not necessarily strictly limited to silicon. In alternative embodiments, it is contemplated that these teachings can also be applied to structures and methods using other semiconductors, such as silicon/germanium and related alloys, gallium arsenide and related compounds and alloys, indium phosphide and related compounds, and other semiconductors, including layered heterogeneous structures.

Additional general background, which help to show the knowledge of those skilled in the art regarding variations and implementations of the disclosed inventions, may be found in the following documents, all of which are hereby incorporated by reference: Coburn, PLASMA ETCHING AND REACTIVE ION ETCHING (1982); HANDBOOK OF PLASMA PROCESSING TECHNOLOGY (ed. Rossnagel); PLASMA ETCHING (ed. Manos and Flamm 1989); PLASMA PROCESSING (ed. Dieleman et al. 1982); Schmitz, CVD OF TUNGSTEN AND TUNGSTEN SILICIDES FOR VLSI/ULSI APPLICATIONS (1992); METALLIZATION AND METAL-SEMICONDUCTOR INTERFACES (ed. Batra 1989); VLSI METALLIZATION: PHYSICS AND TECHNOLOGIES (ed. Shenai 1991); Murarka, METALLIZATION THEORY AND PRACTICE FOR VLSI AND ULSI (1993); HANDBOOK OF MULTILEVEL METALLIZATION FOR INTEGRATED CIRCUITS (ed. Wilson et al. 1993); Rao, MULTILEVEL INTERCONNECT TECHNOLOGY (1993); CHEMICAL VAPOR DEPOSITION (ed. M. L. Hitchman 1993); and the semiannual conference proceedings of the Electrochemical Society on plasma processing; Current Progress in Epitaxial Layer Transfer, Sakaguchi, et al., IEICE Transactions, Vol. E80-C, No.3, March 1997; Epitaxial Layer Transfer by Bond and Etchback of Porous Silicon, Yonehara, et al., Appl. Phys. Lett. 64 (16), 18 Apr. 1994.

What is claimed is:

1. A method of forming a semiconductor-on-insulator structure, comprising the steps of:
    a) forming a structure having porous semiconductor material at a first surface thereof;
    b) sealing said surface;
    c) forming an epitaxial semiconductor layer on said porous semiconductor material after said sealing;
    d) implanting an oxidizing species through said epitaxial layer into said porous semiconductor material;and
    reacting said oxidizing species with said porous semiconductor material to form a buried dielectric layer beneath said epitaxial layer.

2. The method of claim 1, wherein said oxidizing species consists essentially of oxygen.

3. The method of claim 1, wherein said semiconductor layer consists essentially of silicon.

4. A method of forming a semiconductor-on-insulator structure, comprising the steps of:
    a) anodizing a silicon wafer to form porous silicon;
    b) sealing said surface;
    c) forming a semiconductor layer on said porous silicon after said sealing;
    d) implanting an oxidizing species through said epitaxial layer into said porous semiconductor material; and
    e) reacting said oxygen with said porous semiconductor material to form a buried oxide layer.

5. The method of claim 4, wherein said semiconductor layer consists essentially of silicon.

6. A method of forming a semiconductor-on-insulator structure, comprising the steps of:
    a) partially anodizing a silicon wafer to form porous silicon; and thereafter
    b) sealing said surface;
    c) forming an epitaxial semiconductor layer on said porous silicon;
    d) implanting oxygen into said porous silicon through said epitaxial semiconductor layer; and
    e) reacting said oxygen with said porous silicon to form a buried oxide layer.

7. The method of claim 6, wherein said oxidizing species consists essentially of oxygen.

8. The integrated circuit of claim 6, wherein said semiconductor layer consists essentially of silicon.

9. A product made by the process of claim 1.

10. A product made by the process of claim 4.

11. A product made by the process of claim 6.

12. The method of claim 1 wherein said step of sealing includes heating said porous semiconductor material in a hydrogen ambient.

13. The method of claim 4 wherein said step of sealing includes heating said porous semiconductor material in a hydrogen ambient.

14. The method of claim 6 wherein said step of sealing includes heating said porous semiconductor material in a hydrogen ambient.

* * * * *